US008587108B2

(12) United States Patent
Youn et al.

(10) Patent No.: US 8,587,108 B2
(45) Date of Patent: Nov. 19, 2013

(54) PACKAGE FOR SEMICONDUCTOR DEVICE INCLUDING GUIDE RINGS AND MANUFACTURING METHOD OF THE SAME

(75) Inventors: HanShin Youn, Hwaseong-si (KR);
Yonghwan Kwon, Suwon-si (KR);
YoungHoon Ro, Hwaseong-si (KR);
Woojae Kim, Hwaseong-si (KR);
Sungwoo Park, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 124 days.

(21) Appl. No.: 13/188,069

(22) Filed: Jul. 21, 2011

(65) Prior Publication Data
US 2012/0074566 A1    Mar. 29, 2012

(30) Foreign Application Priority Data

Sep. 29, 2010  (KR) .......................... 10-2010-0094617

(51) Int. Cl.
*H01L 21/60*    (2006.01)
(52) U.S. Cl.
USPC ...... 257/684; 257/737; 257/777; 257/E23.02; 257/E23.021
(58) Field of Classification Search
USPC .......... 438/109, 118, 613; 257/684, 737, 777, 257/E23.02, E23.021, E21.513
See application file for complete search history.

(56) References Cited

U.S. PATENT DOCUMENTS

| 7,170,171 | B2 * | 1/2007 | Grigg ............................. | 257/737 |
|---|---|---|---|---|
| 7,928,566 | B2 * | 4/2011 | Yagi et al. ...................... | 257/737 |
| 2001/0026010 | A1 * | 10/2001 | Horiuchi et al. ............... | 257/678 |
| 2002/0109228 | A1 * | 8/2002 | Buchwalter et al. .......... | 257/738 |
| 2003/0176016 | A1 * | 9/2003 | Grigg ............................. | 438/106 |
| 2004/0145064 | A1 * | 7/2004 | Kuramoto et al. ............. | 257/780 |
| 2005/0085016 | A1 * | 4/2005 | McWilliams et al. ......... | 438/114 |
| 2006/0229683 | A1 * | 10/2006 | Wang et al. ....................... | 607/9 |
| 2006/0278997 | A1 * | 12/2006 | Gibson et al. .................. | 257/778 |
| 2006/0284309 | A1 | 12/2006 | Park et al. | |
| 2007/0085221 | A1 * | 4/2007 | Tanabe .......................... | 257/782 |
| 2008/0032457 | A1 * | 2/2008 | McWilliams et al. ......... | 438/125 |
| 2008/0197511 | A1 * | 8/2008 | Lee et al. ....................... | 257/782 |
| 2009/0102048 | A1 * | 4/2009 | Hori ............................... | 257/737 |
| 2011/0244634 | A1 * | 10/2011 | Kim et al. ...................... | 438/124 |

FOREIGN PATENT DOCUMENTS

| JP | 60105241 A | * | 6/1985 |
|---|---|---|---|
| JP | 2003243815 A | | 8/2003 |
| KR | 10-0734264 B1 | | 6/2007 |
| KR | 10-0914172 B1 | | 8/2009 |

* cited by examiner

*Primary Examiner* — George Fourson, III
(74) *Attorney, Agent, or Firm* — Harness, Dickey & Pierce, P.L.C.

(57) ABSTRACT

An example embodiment relates to a semiconductor package. The semiconductor package includes a first substrate including a first pad, a second substrate upwardly spaced apart from the first substrate and including a second pad opposite to the first pad. At least one electrode is coupled between the first pad and the second pad. The semiconductor package includes a guide ring formed at a periphery of the electrode between the first substrate and the second substrate.

19 Claims, 15 Drawing Sheets

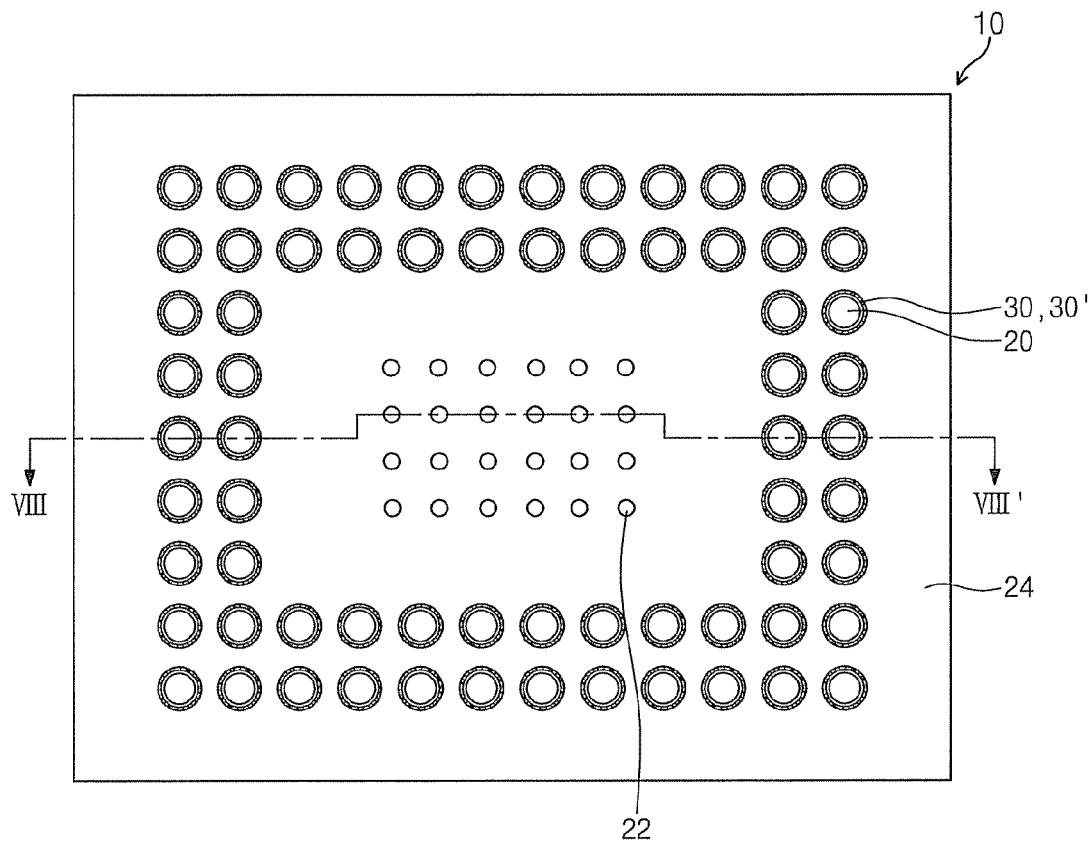

PACKAGE FOR SEMICONDUCTOR DEVICE INCLUDING GUIDE RINGS AND MANUFACTURING METHOD OF THE SAME

CROSS-REFERENCE TO RELATED APPLICATIONS

This US non-provisional patent application claims priority under 35 USC §119 to Korean Patent Application No. 10-2010-0094617, filed on Sep. 29, 2010, the contents of which is incorporated herein in its entirety by reference.

BACKGROUND

Example embodiments of the inventive concepts described herein generally relate to semiconductor packages and manufacturing methods of the same and, more particularly, to a semiconductor package capable of mounting a plurality of integrated circuits and manufacturing methods of the same.

In recent years, wafer-level chip size packages have become a popular packaging technology. In a wafer-level chip size package, integrated circuit chips (IC chips) are mounted on a substrate in a so-called 'flip chip' manner. A semiconductor package allows a plurality of IC chips to be stacked sequentially.

SUMMARY

Example embodiments of the inventive concepts relate to semiconductor packages and manufacturing methods of the same.

According to example embodiments of the inventive concepts, a semiconductor package may include a first substrate including a first pad, a second substrate upwardly spaced apart from the first substrate and including a second pad opposite to the first pad, at least one electrode coupled between the first pad and the second pad, and a guide ring formed at a periphery of the electrode between the first substrate and the second substrate.

The guide ring of the semiconductor package may be configured to conform to a shape of the periphery of the electrode.

The guide ring of the semiconductor package may be arranged between the electrode and an adjacent electrode so the guide ring is configured to prevent an electrical short between the electrode and the adjacent electrode.

The guide ring of the semiconductor package may include a top surface and a bottom surface. The top surface of the guide ring may be connected to the second substrate, and the bottom surface of the guide ring may be connected to the first substrate.

The guide ring of the semiconductor package may include a tube surrounding the electrode. The tube may be configured to conform to a circumference of the electrode. At least one solder ball may be arranged within the guide ring. The guide ring may also be arranged between the electrode and an adjacent electrode so the guide ring is configured to prevent an electrical short between the electrode and the adjacent electrode.

The guide ring of the semiconductor package may include at least one pillar configured to conform to a circumference of the electrode. At least one solder ball may be arranged within the guide ring. The guide ring may also be arranged between the electrode and an adjacent electrode so the guide ring is configured to prevent an electrical short between the electrode and the adjacent electrode.

The guide ring of the semiconductor package may include at least four pillars, each pillar is positioned at a different corner of a four-sided perimeter surrounding the electrode. The guide ring may further include a top surface and a bottom surface, and the top surface of the guide ring may be connected to the second substrate, and the bottom surface of the guide ring may be connected to the first substrate.

The guide ring may contain a dielectric material or a high-molecular compound.

The first substrate of the semiconductor package may further include a first photo solder resist configured to support the guide ring, and the second substrate of the semiconductor package may further include a second photo solder resist configured to support the guide ring.

According to example embodiments of the inventive concepts, a semiconductor package may include a first substrate including a first pad, a second substrate upwardly spaced apart from the first substrate and including a second pad opposite to the first pad, at least one electrode coupled between the first pad and the second pad, and a guide ring formed at a periphery of the electrode between the first substrate and the second substrate. The guide ring of the semiconductor package may be configured to conform to a shape of the periphery of the electrode. The guide ring of the semiconductor package may be arranged between the electrode and an adjacent electrode so the guide ring is configured to prevent an electrical short between the electrode and the adjacent electrode.

The guide ring of the semiconductor package may include a tube surrounding the electrode.

The guide ring of the semiconductor package may include a plurality of pillars configured to conform to a circumference of the electrode. The electrode may be arranged inside the plurality of pillars.

The guide ring of the semiconductor package may include a top surface and a bottom surface. The top surface of the guide ring may be connected to the second substrate, and the bottom surface of the guide ring may be connected to the first substrate.

According to example embodiments of the inventive concepts, a semiconductor package may include a first substrate including a first pad, a second substrate upwardly spaced apart from the first substrate and including a second pad opposite to the first pad, at least one electrode coupled between the first pad and the second pad, and a guide ring formed at a periphery of the electrode between the first substrate and the second substrate. The guide ring of the semiconductor package may include a top surface and a bottom surface. The top surface of the guide ring may be connected to the second substrate, and the bottom surface of the guide ring may be connected to the first substrate.

The guide ring of the semiconductor package may include at least four pillars, each pillar is positioned at a different corner of a four-sided perimeter surrounding the electrode.

Example embodiments of the inventive concepts relate to a manufacturing method of a semiconductor package, including providing a first substrate including a first pad, providing a second substrate including a second pad opposite to the first pad, forming a guide ring to surround one of the first pad and the second pad on at least one of the first and second substrates, forming at least one electrode on one of the first pad and the second pad, and bonding the first substrate and the second substrate to each other to connect the first pad and the second pad to the electrode.

Forming a guide ring may include one of a dispensing, printing and a photolithography process.

Providing the first substrate may include forming the first pad on the first substrate, forming a first photo solder resist on the entire surface of the first substrate including the first pad, and removing the first photo solder resist on the first pad to expose the first pad.

The forming the at least one electrode may include forming a first electrode on the first pad and forming a second electrode on the second pad.

The guide ring may align the first electrode or the second electrode when the first substrate and the second substrate are bonded to each other.

The guide ring may be formed on the first photo solder resist at a circumference of the first pad.

The second substrate may further include a second photo solder resist to selectively expose the first pad. The manufacturing method may further include heating the guide ring to be bonded to the first and second photo solder resists after bonding the first substrate and the second substrate to each other.

The providing of the first substrate may include forming a first photo solder resist on the first substrate, aligning the first pad on the first photo solder resist, and melt-bonding the first pad onto the first substrate. The melt-bonding of the first pad may include heating the first substrate.

The manufacturing method may further include forming a first integrated circuit chip on the first substrate after forming the guide ring.

According to example embodiments of the inventive concepts, the manufacturing method of a semiconductor package may include providing a first substrate including an electrode pad and a bump pad, forming a guide ring on the first substrate at the circumference of the electrode pad, forming a first integrated circuit chip on the bump pad, and bonding a second substrate, where an electrode is formed to be opposite to the electrode pad, onto the first substrate.

BRIEF DESCRIPTION OF THE DRAWINGS

Example embodiments of the inventive concepts will become more apparent in view of the attached drawings and accompanying detailed description. The example embodiments depicted therein are provided by way of example, not by way of limitation, wherein like reference numerals refer to the same elements. The drawings are not necessarily to scale, emphasis instead being placed upon illustrating aspects of example embodiments of the inventive concepts.

DETAILED DESCRIPTION

Figure 1A:
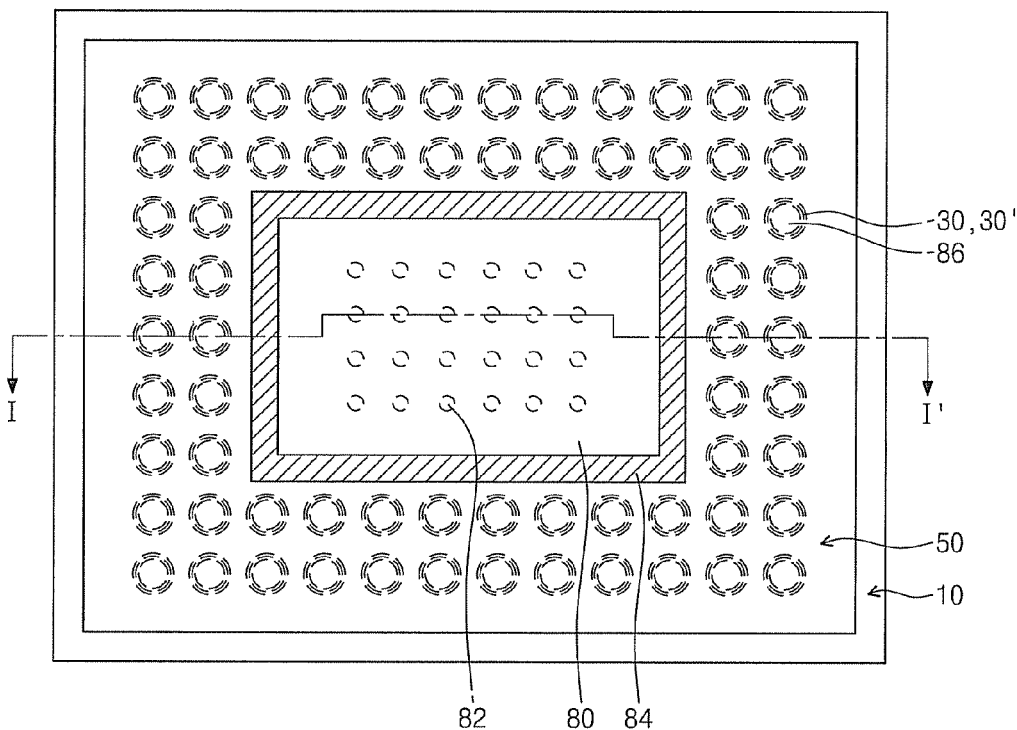
FIG. 1A is a top plan view illustrating a semiconductor package according to example embodiments of the inventive concepts.

Example embodiments of the inventive concepts will now be described more fully hereinafter with reference to the accompanying drawings, in which example embodiments of the inventive concepts are shown. It should be noted, however, that example embodiments of the inventive concepts are may be embodied in many different forms and should not be construed as being limited to the embodiments set forth herein; rather, these example embodiments are provided so that this disclosure will be thorough and complete, and will fully convey the concept of the example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all teens (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
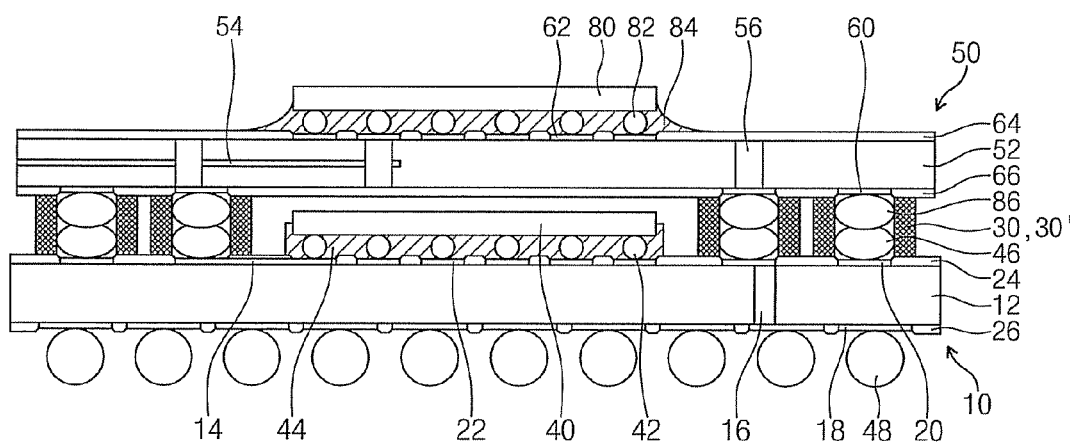
FIG. 1B is a cross-sectional view taken along the line I-I' in FIG. 1A.
Figure 2:
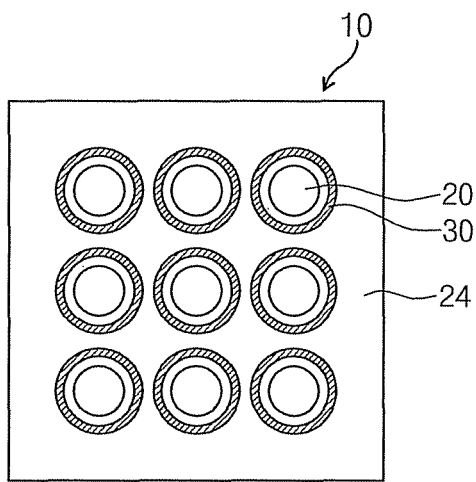
FIGS. 2 to 3 are top plan views specifically illustrating a guide ring shown in FIG. 1A.
Figure 3:
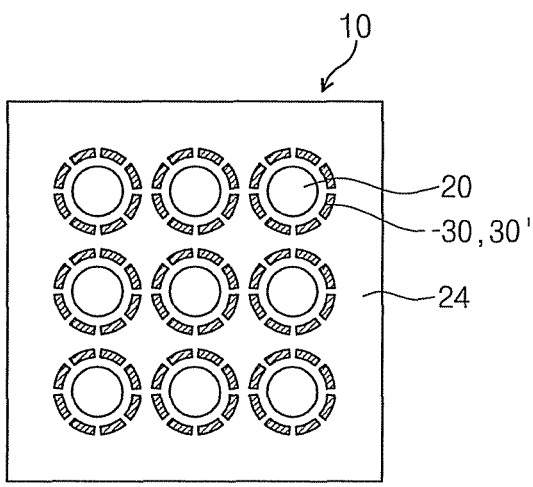

FIG. 1A is a top plan view illustrating a semiconductor package according to example embodiments of the inventive concepts, and FIG. 1B is a cross-sectional view taken along the line I-I' in FIG. 1A. FIGS. 2 to 4 are top plan views illustrating a guide ring shown in FIG. 1A.

Referring to FIGS. 1A to 3, a semiconductor package according to example embodiments of the inventive concepts may include guide rings 30 (or 30') formed at the peripheries (for example, circumferences) of first upper solder balls 46 and second lower solder balls 86 between a first substrate 10 and a second substrate 50. The first upper solder balls 46 and the second lower solder balls 86 may electrically connect first upper ball pads 20 of the first substrate 10 to second lower ball pads 60 of the second substrate 50. The guide rings 30 may surround the first upper solder balls 46 and the second lower solder balls 86.

A guide ring 30 (or 30') may be arranged between a pair of a first upper solder ball 46 coupled to a second lower solder ball 86, and an adjacent pair of a first upper solder ball 46 coupled to a second lower solder ball 86. As such, a guide ring 30 (or 30') may minimize a pair first upper solder ball 46 coupled to a second lower solder ball 86 from contacting an adjacent pair of a first upper solder ball 46 coupled to a second lower solder ball 86. Thus, the semiconductor package may reduce short-circuit of the first upper solder balls 46 and the second lower solder balls 86 between the first substrate 10 and the second substrate 50.

Each of the first and second substrates 10 and 50 may include a printed circuit board (PCB). The first substrate 10 and the second substrate 50 may mount at least one first integrated circuit chip 40 and at least one second integrated circuit chip 80 thereon, respectively. The first integrated circuit chip 40 may be fixed to the first substrate 10 by first bumps 42 and a first encapsulation resin 44. The first bumps 42 may be bonded to first bump pads 22 on the first substrate 10. Similarly, the second integrated circuit chip 80 may be fixed to the second substrate 50 by second bumps 82 and a second encapsulation resin 84. The second bumps 82 may be bonded second bump pads 62 on the second substrate 50.

The first substrate 10 may include a first main frame 12, first bump pads 22 formed on the center of the first main frame 12, first upper ball pads 20 formed on the edge of the first main frame 12 along outer circumferences of the first bump pads 22, first lower ball pads 18 formed beneath the first main frame 12, and first upper and lower photo solder resists 24 and 26 formed on and beneath the first main frame 12 to selectively expose the first upper and lower ball pads 20 and 18 and the first bump pads 22. While FIG. 1B shows the first bump pads 22 formed on the center of the first main frame 12 and first upper ball pads 20 formed on the edge of the first main frame 12, example embodiments are not limited thereto.

The first bump pads 22 and the first upper balls pads 20 may be insulated by the first upper photo solder resist 24. The first bump pads 22 and the first upper ball pads 20 may be electrically connected by a first wire 14 on the first main frame 12. The first upper photo solder resist 24 may be arranged on the first wire 14. The first wire 14 may also be arranged inside or beneath the first main frame 12. The first upper and lower ball pads 20 and 18 may be connected to a first through-electrode 16 formed in the main frame 12. The first through-electrode 16 may electrically connect the first bump pads 22 to the first lower ball pads 18. The first lower ball pads 18 may be bonded to a first lower solder ball 48. The first upper ball pads 20 may be bonded to the first upper solder ball 46. The guide ring 30 (or 30') may be arranged at the periphery (for example, circumference) of the first upper solder ball 46. The guide ring 30 (or 30') may be arranged on the first upper photo solder resist 24.

The second substrate 50 may include a second main frame 52, second bump pads 62 formed on the second main frame 52, a second lower ball pad 60 formed beneath the second main frame 52, and second upper and photo solder resists 64 and 66 formed on and beneath the second main frame 52 to selectively expose the second bump pads 62 and the second lower ball pads 60.

The second bump pads 62 and the second lower ball pads 60 may be electrically connected to a second through-electrode 56 formed in the second main frame 52 by a second wire 54. While FIG. 1B illustrates the second through-electrode 56 perpendicularly passing through the inside of the second main frame 52, example embodiments are not limited thereto. The second through-electrode 56 may be connected to at least one of the second bump pads 61 and the second lower ball pad 60. The second through-electrode 56 may be connected to the second wire 54. The second wire 54 may be arranged inside the second frame 52. The second wire 54 may also be arranged on top and bottom surfaces of the second main frame 52. A second lower solder ball 86 may be arranged beneath the second lower ball pad 60.

The second lower solder ball 86 may be connected to the first upper solder ball 46. The first upper solder ball 46 and the second lower solder ball 86 may be arranged in a direction orthogonal to the first substrate 10 and the second substrate 50. The first upper solder ball 46 and the second lower solder ball 86 may serve as an electrode connecting the first substrate 10 to the second substrate 50. The first upper solder ball 46 and the second lower solder ball 86 may have the same size. The first upper solder ball 46 and the second lower solder ball 86 may each be smaller in diameter than each of the guide rings 30 (or 30').

The guide ring 30 (or 30') may surround the first upper solder balls 46 and the second lower solder balls 86. For example, the guide ring 30 (or 30') may contain a dielectric material or a high-molecular compound to insulate the first upper solder balls 46 and the second lower solder balls 86. The high-molecular compound may be a high molecular weight polymer, but example embodiments are not limited thereto. The guide ring 30 (or 30') may have a tube or pillar shape, but example embodiments are not limited thereto.

FIG. 2 illustrates a guide ring 30 including a tube shape. A tube-shaped guide ring 30 may be a guide ring 30 in which the first upper solder balls 46 and the second lower solder balls 86 are arranged within the guide ring 30 so the guide ring 30 is aligned with the first upper ball pad 20. The guide ring 30 including a tube shape may conform to a circumference of the first upper solder ball 46 coupled to the second lower solder ball 86 arranged within the guide ring 30.

FIG. 3 illustrates a guide ring 30' having a pillar shape. A pillar-shaped guide ring 30' may include a plurality of pillars arranged along the peripheries (e.g., circumferences) of the first upper solder balls 46 and the second lower solder balls 86. A pillar-shaped guide ring 30' may be aligned with the first upper ball pad 20. The pillar-shaped guide ring 30' may include a plurality of pillars that are configured to conform to a circumference of the first upper solder ball 46 coupled to the second lower solder ball 86 arranged within the guide ring 30'.

Figure 4A:
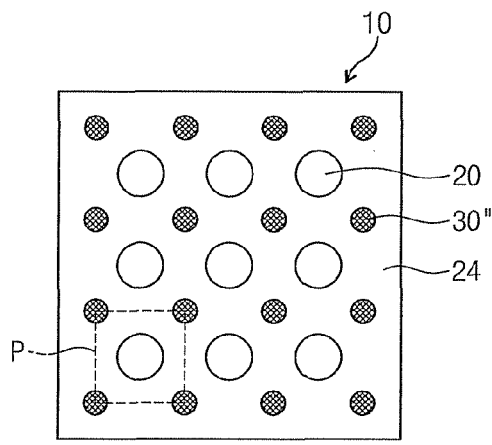
FIGS. 4A, 4B, and 4C are top plan views illustrating alternative arrangements of the guide ring according to example embodiments of the inventive concepts.

Alternatively, as shown in FIG. 4A, pillar-shaped guide rings 30'' may be alternately arranged with the first upper solder balls 46 and the second lower solder balls 86, between the first substrate 10 and the second substrate 50, so pillar-shaped guide rings 30'' are not aligned with the first upper ball pads 20. The pillar-shaped guide rings 30'' are the same as (or substantially the same as) the guide rings 30 and 30' illustrated in FIGS. 2 and 3, except the pillar-shaped guide rings 30'' are alternately arranged with the first upper solder balls 46 and the second lower solder balls 86. FIG. 4A illustrates a four-sided perimeter P surrounding a first upper ball pad 20. As shown in FIG. 4A, the pillar-shaped guide rings 30'' may include at least four pillars, with each pillar positioned at a different corner of the four-sided perimeter P surrounding the upper ball pad 20; however, example embodiments are not limited to the configuration of pillar-shaped guide rings 30'' illustrated in FIG. 4A.

Figure 4B:
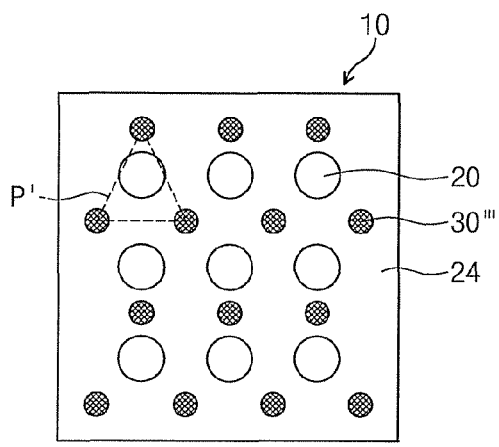
Figure 4C:
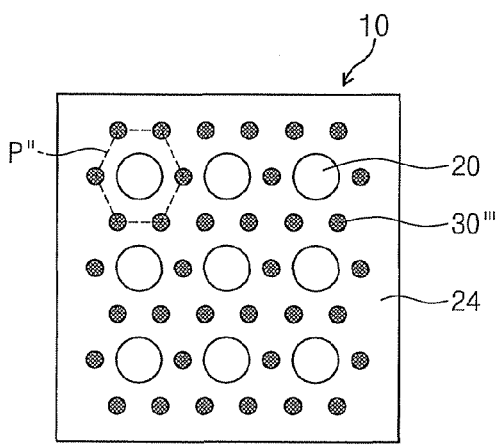

While FIG. 4A illustrates four pillars 30'' positioned at the corners of a four-sided perimeter surrounding the upper ball pad 20, example embodiments are not limited thereto. According to example embodiments, more than four pillars 30'' or fewer than four pillars 30'' may surround the first upper solder balls 46 and the second lower solder balls 86, and more than four pillars 30'' or fewer than four pillars 30'' may be positioned at the corners of a perimeter with greater or fewer than four sides surrounding the upper ball pad 20. For example, as shown in FIG. 4B, example embodiments may include three pillars 30''' positioned at the corners of a three-sided perimeter P' surrounding the upper ball pad 20. Alternatively, as shown in FIG. 4C, example embodiments may include five pillars 30'''' positioned at the corners of a six-sided perimeter P''' surrounding the upper ball pad 20. In addition, FIG. 4C illustrates that the guide ring 30'''' conforms better to the shape of a circumference of the upper ball pads 20, and/or first upper solder balls 46 coupled to second lower solder balls 86 (not shown in FIG. 4C), as the perimeter P''' increases from a four-sided perimeter P in FIG. 4A to a five-sided perimeter P''' in FIG. 4C.

The guide rings 30 (or 30' or 30'' or 30''' or 30'''') may serve as a spacer making a distance between the first substrate 10 and the second substrate 20. The guide rings 30 (or 30' or 30'' or 30''' or 30'''') may fix the first substrate 10 and the second substrate 50. The guide rings 30 (or 30' or 30'' or 30''' or 30'''') may be smaller in height than the first upper solder balls 46 and the second lower solder balls 86. The guide rings 30 (or 30') may allow the first upper solder balls 46 and the second lower solder balls 86 to be aligned between the first substrate 10 and the second substrate 50. The guide rings 30 (or 30') may protect the first upper solder balls 46 and the second lower solder balls 86. The guide rings 30 (or 30') may prevent short-circuit of the first solder balls 46 and the second lower solder balls 80. The guide rings 30 (30' or 30'' or 30''' or 30'''') may replace conventional resins filling a space between the first substrate 10 and the second substrate 50. Thus, a semiconductor package according to example embodiments of the inventive concepts may increase productivity and production yield.

Now, a manufacturing method of a semiconductor package according to example embodiments of the inventive concepts will be described below in detail.

Figure 5A:
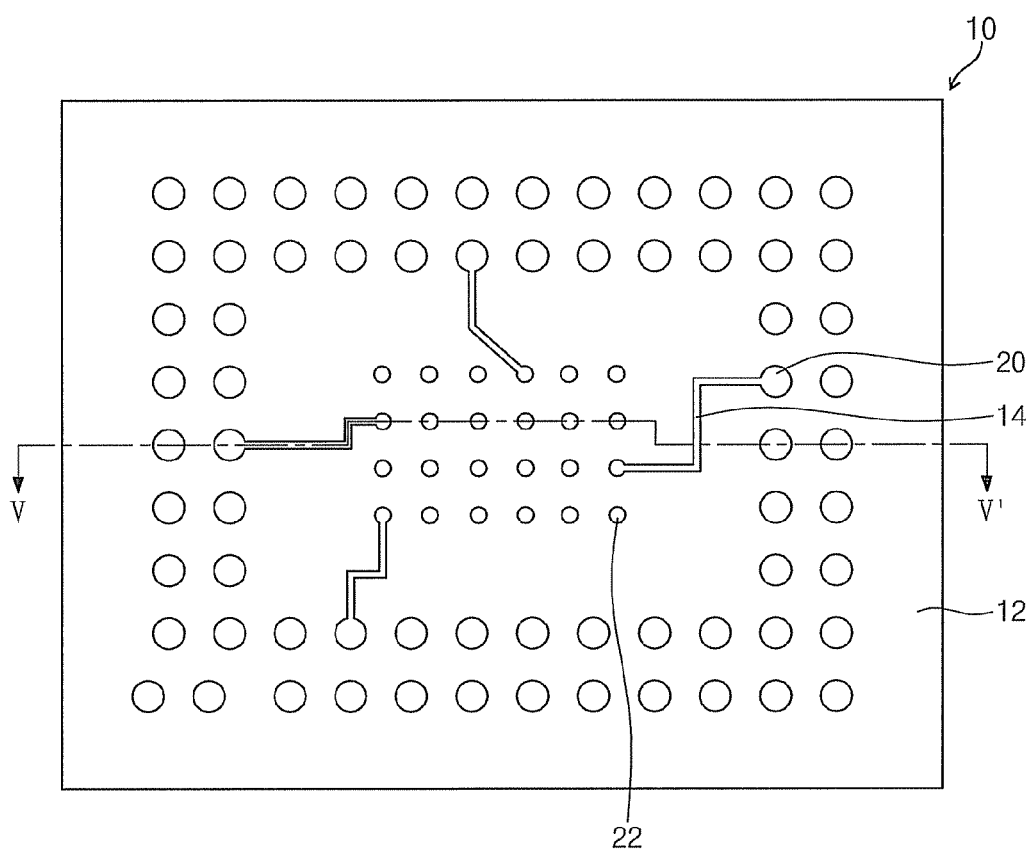
FIGS. 5A to 12B, are process top plan views and process cross-sectional views illustrating a manufacturing method of a semiconductor package according to example embodiments of the inventive concepts, respectively.

FIGS. 5A to 11C, and 12A to 12B, are process top plan views and process cross-sectional views illustrating a manufacturing method of a semiconductor package according to example embodiments of the inventive concepts, respectively. Package processes for a first substrate 10 and a second substrate 50 may be performed in a similar manner. For this reason, the manufacturing method will be described mainly with reference to process top plan views of the first substrate 10, and process top plan views until bonding the second substrate 50 to the first substrate 10 may be omitted. For example, FIG. 5A is a top plan view of the first substrate 10 which illustrates a manufacturing method of a semiconductor package according to example embodiments of the inventive concept, FIG. 5B is a cross-sectional view of the second substrate 50 which is taken along the line V-V' in FIG. 5A, and FIG. 5C is a cross-sectional view of the first substrate 10 which is taken along the line V-V' in FIG. 5A.

Figure 5B:
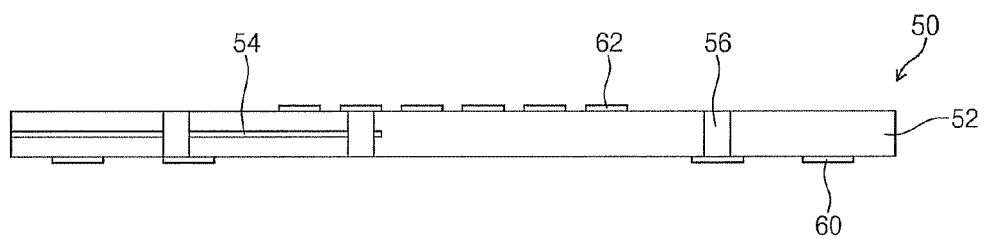
Figure 5C:
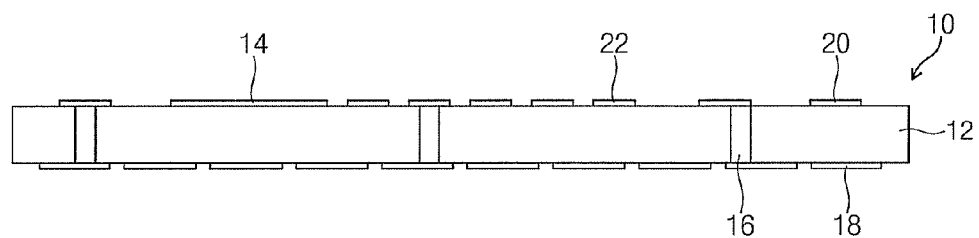

Referring to FIGS. 5A and 5C, a first main frame 12 may be provided where first upper ball pads 20, first lower ball pads 18, first bump pads 22, first through-electrodes 16, and first wires 14 are formed. The first main frame 12 may include an insulating substrate. The first upper ball pads 20, the first lower ball pads 18, the first bump pads 22, the first through-electrodes 16, and the first wires 14 may contain an electrically conductive metal. The first bump pads 22 may be arranged at the center of the first main frame 12, and the first upper ball pads 20 and the first lower ball pads 18 may be arranged on the edge of the first main frame 12, although example embodiments are not limited thereto. While FIG. 5C illustrates the first through-electrodes 16 may be perpendicularly arranged inside the first main frame 12, example embodiments are not limited thereto.

Referring to FIG. 5B, a second main frame 52 may be provided where first lower ball pads 60, second bump pads 62, second through-electrodes 56, and second wires 54 are formed. The second main frame 52 may include an insulating substrate. Similarly, the first lower ball pads 60, the second bump pads 62, the second through-electrodes 56, and the second wires 54 may contain an electrically conductive metal. The second bump pads 62 may be arranged at the center of the second substrate 50 and the second lower ball pads 60 may be arranged on the lower edge of the second substrate 50, although example embodiments are not limited thereto. While FIG. 5B illustrates the second through-electrode 56 perpendicularly arranged through the second main frame 52, example embodiments are not limited thereto.

Figure 6A:
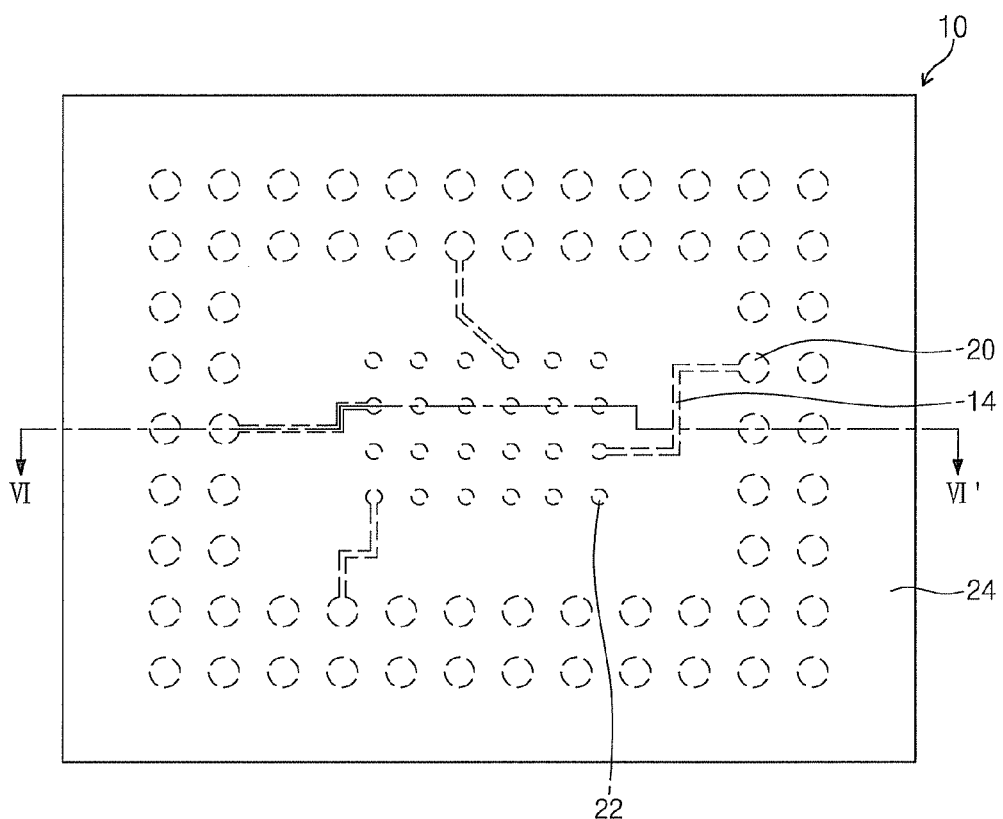
Figure 6B:
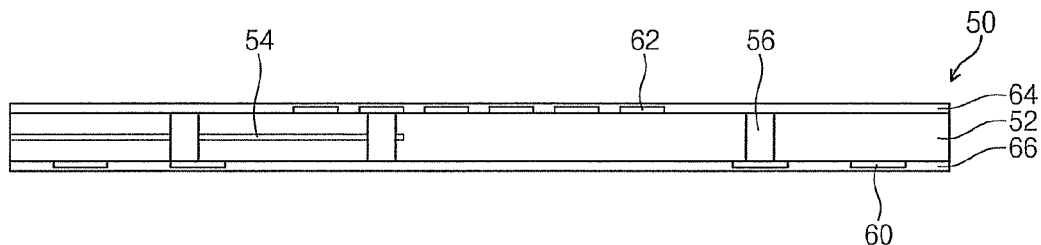
Figure 6C:
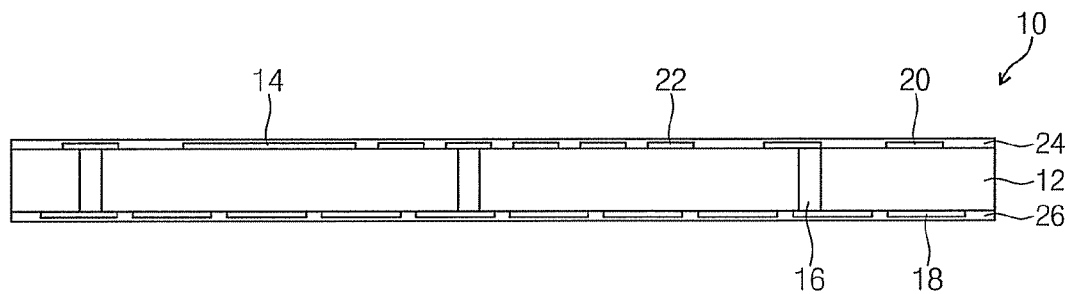

Referring to FIGS. 6A to 6C, FIG. 6A a top plan view of the first substrate 10, FIG. 6B is a cross-sectional view of the second substrate 50, which is taken along the line VI-VI' in FIG. 6A, and FIG. 6C is a cross-sectional view of the first substrate 10 which is taken along the line VI-VI' in FIG. 6A. FIGS. 6A and 6C illustrate first upper and lower photo solder resists 24 and 26 may be formed upper and lower entire surfaces of the first main frame 12, respectively. The first upper photo solder resist 24 may be formed on the first upper ball pads 20, the first bump pads 22, and the first wires 14. The first lower photo solder resist 26 may cover the first lower ball pads 18. For example, the first upper and lower solder ball resists 24 and 26 may be formed by means of a dipping (or alternatively a coating) method.

Referring to FIG. 6B, second upper and lower photo solder resists 64 and 66 may be formed on upper and lower entire surfaces (or alternatively partial surfaces) of the second main frame 52, respectively. The second upper photo solder resist 64 may be formed on the second bump pads 62. The second lower photo solder resist 66 may cover the second lower ball pad 60.

Figure 7A:
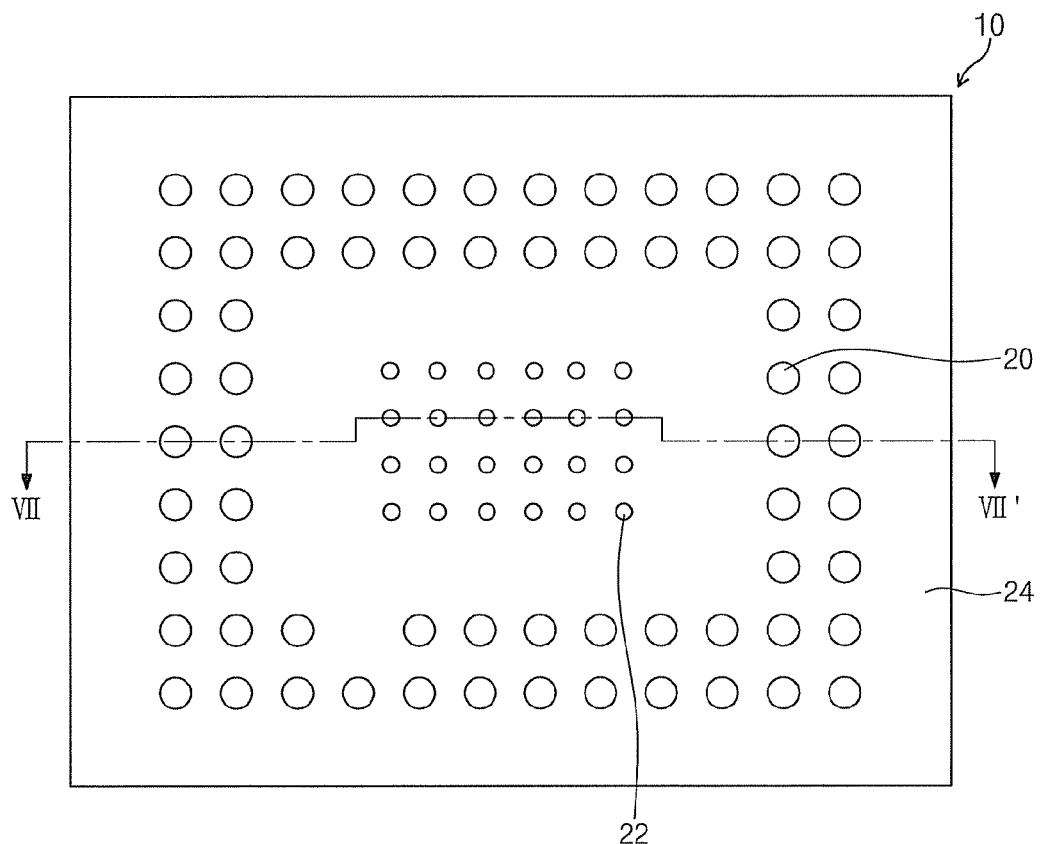
Figure 7B:
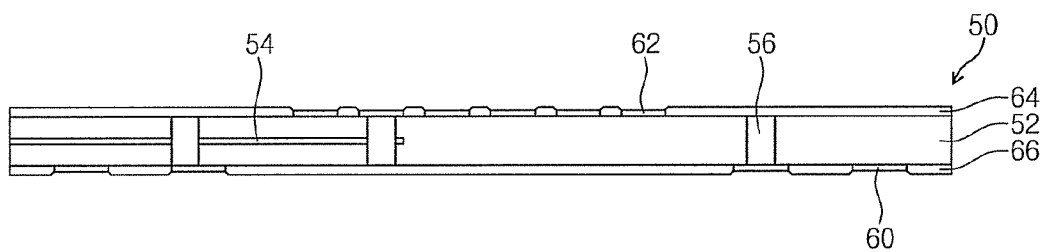
Figure 7C:
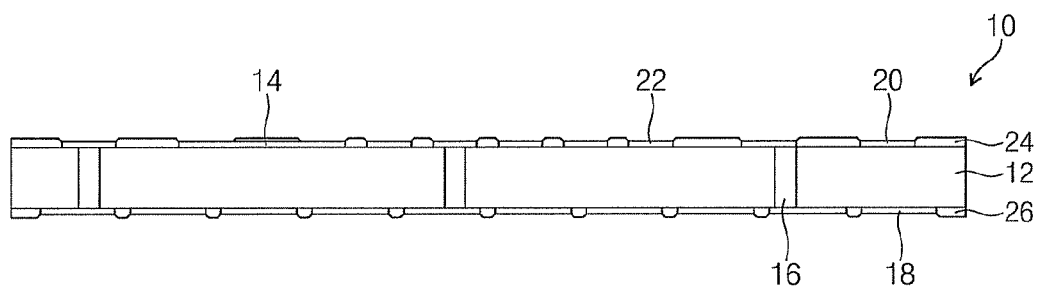

Referring to FIGS. 7A to 7C, FIG. 7A a top plan view of the first substrate 10, FIG. 7B is a cross-sectional view of the second substrate 50 which is taken along the line VII-VII' in FIG. 7A, and FIG. 7C is a cross-sectional view of the first substrate 10 which is taken along the line VII-VII' in FIG. 7A. FIG. 7C illustrates the first upper and lower photo solder resists 24 and 26 may be patterned, for example by a photolithography method or other suitable patterning method. The patterns of first upper and lower photo solder resists 24 and 26 may expose the first upper ball pads 20, the first bump pads 22, and the first lower ball pads 18. The first upper photo solder resist 24 may protect the first wire 14.

Referring to FIG. 7B, the second upper and lower photo solder resists 64 and 66 may be patterned to selectively expose the second lower ball pads 60 and the second bump pads 62. Thereafter, a metal thin film (not shown) may be formed on the first bump pads 22, the first upper and lower pads 20 and 18, the second bump pads 62, and the second lower ball pads 60.

Although not shown, the first upper photo solder resist 24 may be formed prior to formation of the first upper ball pads 20 and the first bump pads 22. The first upper photo solder resist 24 may be formed on the main frame 12. Next, the first upper ball pads 20 and the first bump pads 22 may be aligned on the first upper photo solder resist 24. Next, the first substrate 10 may be heated to melt-bond the first upper ball pads 20 to the second main frame 20.

Figure 8C:
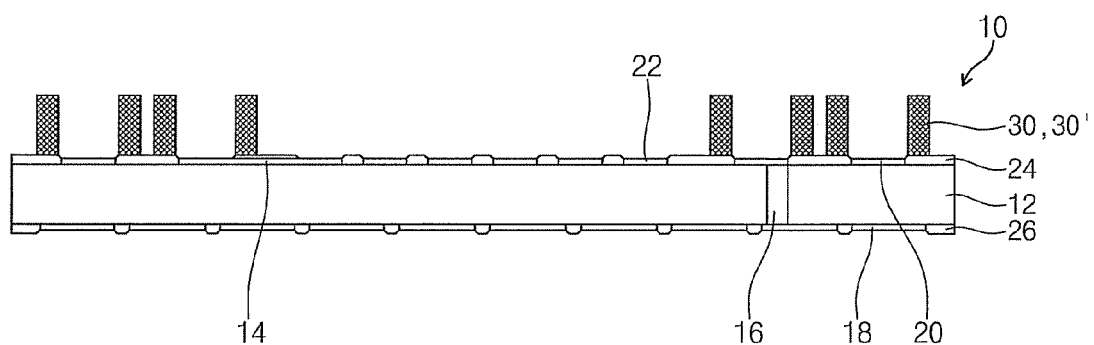

Referring to FIGS. 8A to 8C, FIG. 8A a top plan view of the first substrate 10, FIG. 8B is a cross-sectional view of the second substrate 50 which is taken along the line VIII-VIII' in FIG. 8A, and FIG. 8C is a cross-sectional view of the first substrate 10 which is taken along the line VIII-VIII' in FIG. 8A. FIGS. 8A and 8C illustrate a plurality of guide rings 30 (or 30') may be formed on the first upper photo solder resists 24 at the peripheries (e.g., circumferences) of the first upper ball pads 20. For example, the guide rings 30 (or 30') may be formed by means of at least one of dispensing, printing, and photolithography methods; however, example embodiments are not limited thereto. The guide rings 30 (or 30') may protrude on the first upper photo solder resists 24 to have a desired (or alternatively predetermined) height. The first upper ball pads 20 may be selectively exposed in the guide rings 30 (or 30').

Referring to FIGS. 7B to 8B, the second substrate 50 may be continued to the next process during the formation of the guide rings 30 (or 30') of the first substrate 10 without adding any process. Although not shown, guide rings 30 (or 30') alternatively may be formed at the peripheries (e.g., circumferences) of the second lower ball pads 60 of the second substrate 50 when the guide rings 30 (or 30') are not formed on the first substrate 10.

Figure 9A:
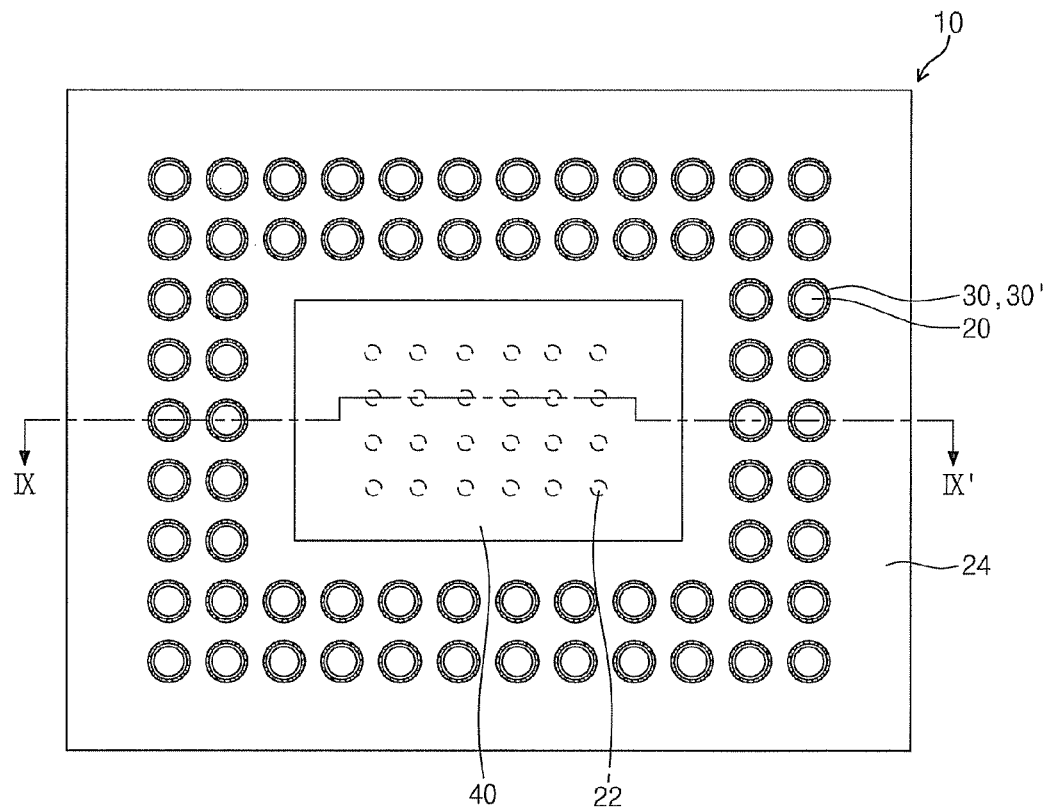
Figure 9B:
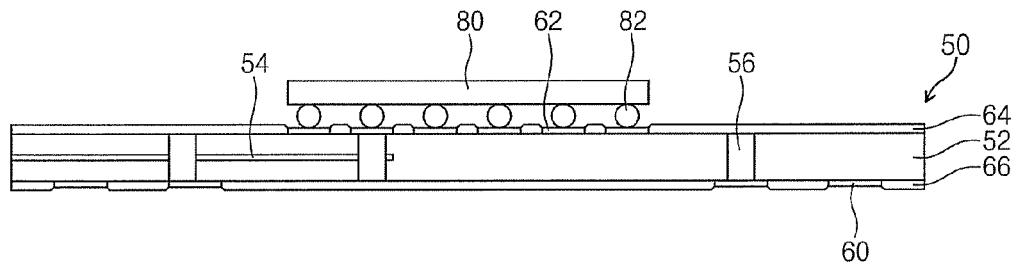
Figure 9C:
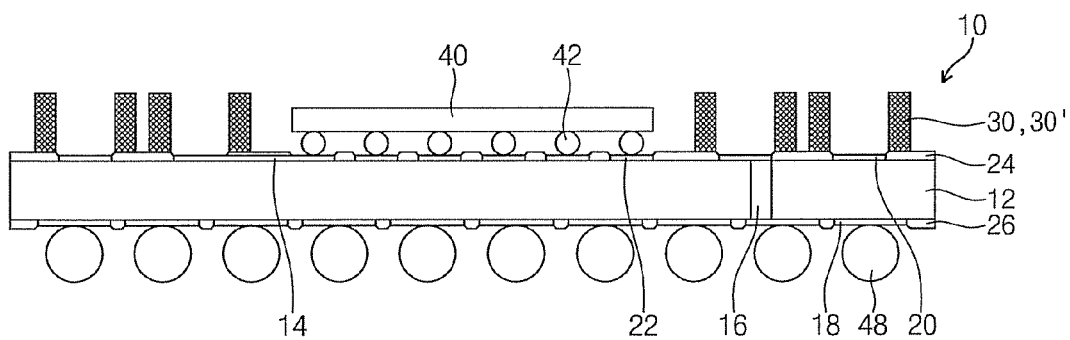

Referring to FIGS. 9A and 9C, FIG. 9A a top plan view of the first substrate 10, FIG. 9B is a cross-sectional view of the second substrate 50 which is taken along the line IX-IX' in FIG. 9A, and FIG. 9C is a cross-sectional view of the first substrate 10 which is taken along the line IX-IX' in FIG. 9A. FIGS. 9A and 9C illustrate first bumps 42 and at least one first integrated circuit chip 40 may be formed on the first bump pads 22, and first lower solder balls 48 may be bonded to the first lower ball pads 18. The first integrated circuit chip 40 may be aligned on the first substrate 10. The first integrated circuit chip 40 may be bonded to the first substrate 10 by the first bumps 42. The first integrated circuit chip 40 and the first substrate 10 may compress the first bumps 42 due to an external force. The first bumps 42 may establish an electrical connection between the first integrated circuit chip 40 and the first bump pads 22. Although not shown, the first integrated circuit chip 40 may be wire-bonded or TAB-bonded to the first substrate 10.

Referring to FIG. 9B, second bumps 82 and at least one second integrated circuit chip 80 may be formed on the second bump pads 62. The second integrated circuit chip 80 and the second bumps 82 may be aligned on the second substrate 50. The second integrated circuit chip 80 may be wire-bonded or TAB-bonded to the second substrate 50.

Figure 10A:
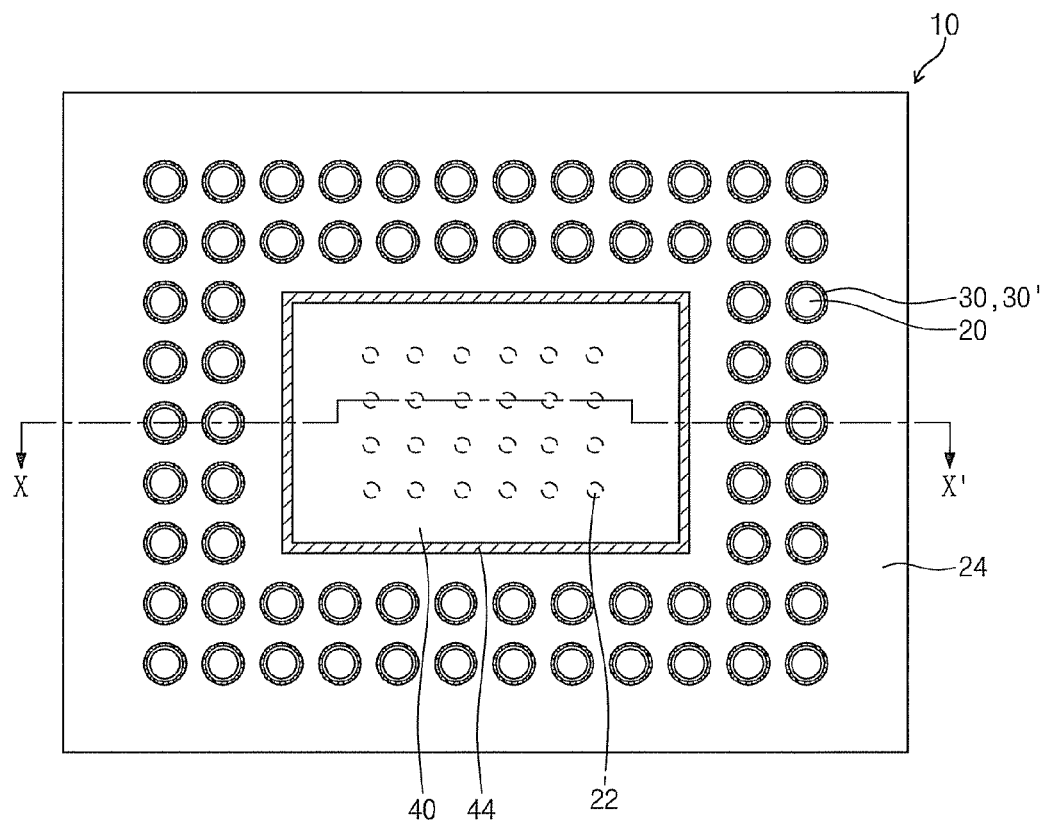
Figure 10B:
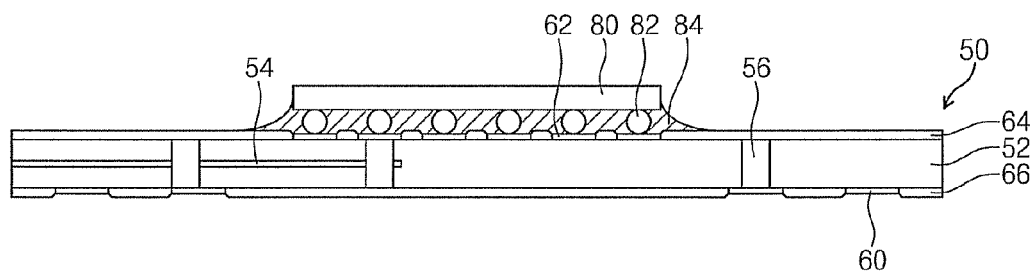
Figure 10C:
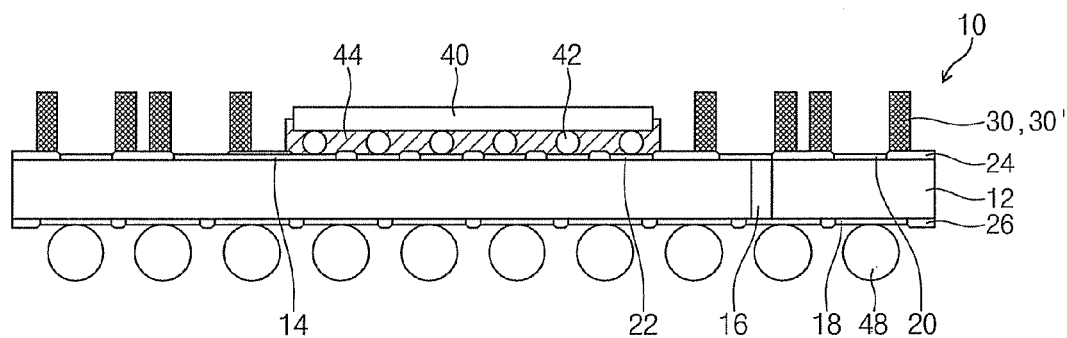

Referring to FIGS. 10A to 10C, FIG. 10A a top plan view of the first substrate 10, FIG. 10B is a cross-sectional view of the second substrate 50 which is taken along the line X-X' in FIG. 10A, and FIG. 10C is a cross-sectional view of the first substrate 10 which is taken along the line X-X' in FIG. 10. FIGS. 10A and 10C illustrate a first sealing resin 44 may be formed between the first integrated circuit chip 40 and the first bump pads 22. The first sealing resin 44 may fix the first bumps 42 and the first integrated circuit chip 40 to the first substrate 10.

Referring to FIG. 10B, a second sealing resin 84 may be formed between the second integrated circuit chip 80 and the second bump pads 62. The second sealing resin 84 may fix the second bumps 82 and the second integrated circuit chip 80 to the second substrate 50.

Figure 11A:
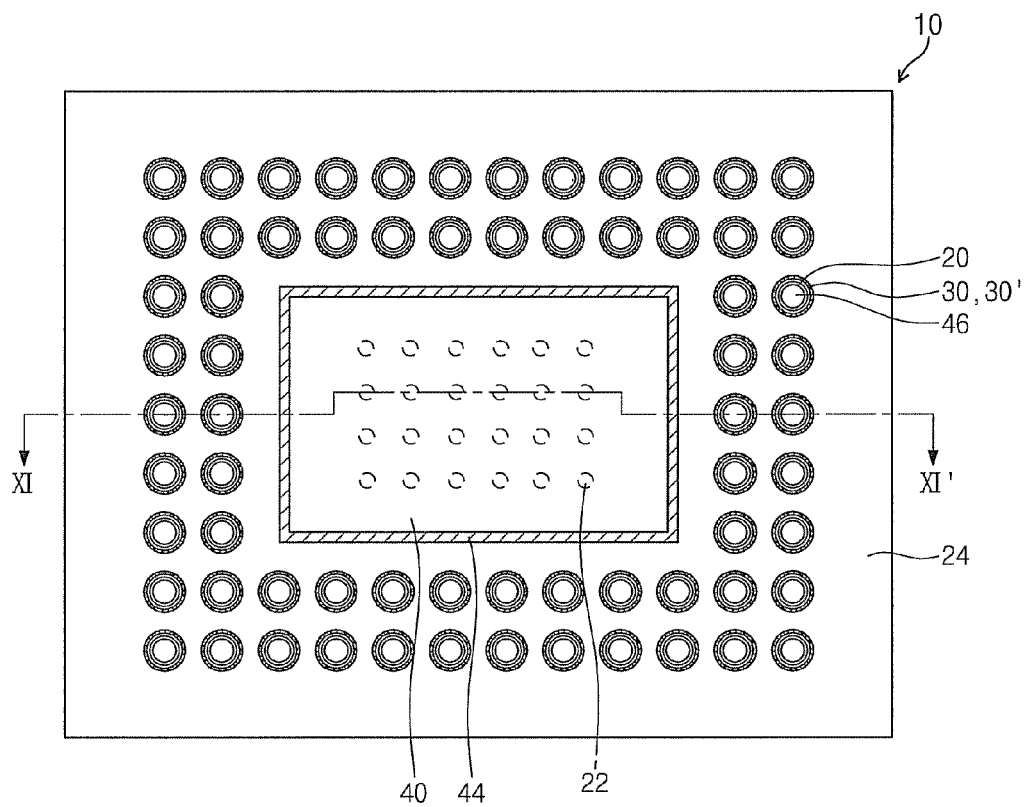
Figure 11B:
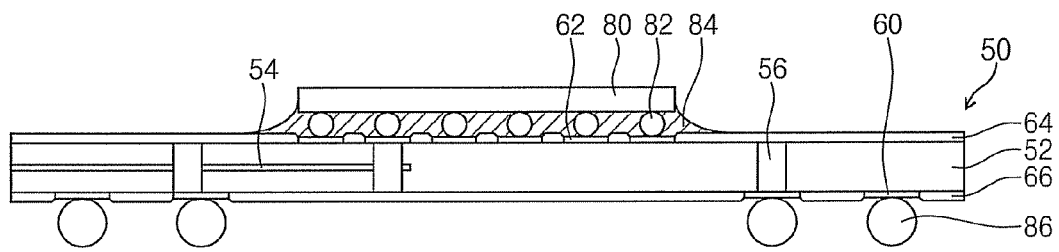
Figure 11C:
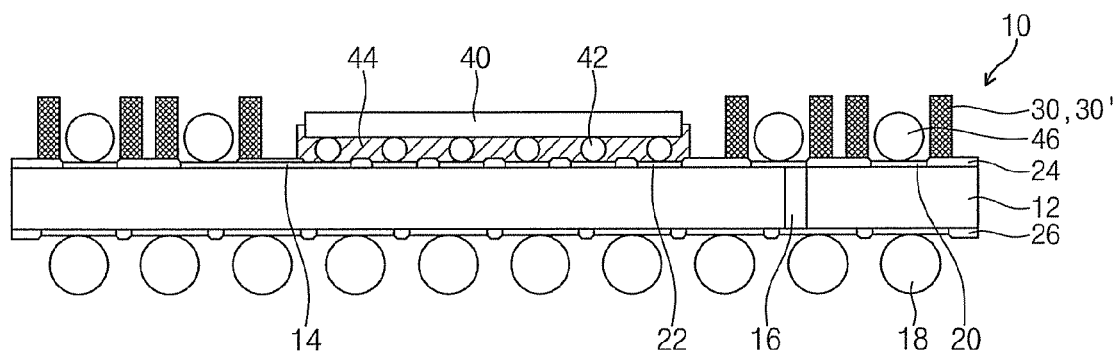

Referring to FIGS. 11A to 11C, FIG. 11A a top plan view of the first substrate 10, FIG. 11B is a cross-sectional view of the second substrate 50 which is taken along the line XI-XI' in FIG. 11A, and FIG. 11C is a cross-sectional view of the first substrate 10 which is taken along the line XI-XI' in FIG. 11. FIGS. 11A and 11C illustrate the first upper solder balls 46 may be bonded onto first upper ball pads 20. The first upper solder balls 46 may be inserted into the guide rings 30 (or 30'). Each of the first upper solder balls 46 may have a diameter smaller than an inner radius (or width) of each of the guide rings 30 (or 30'). Each of the first upper solder balls 46 may have a diameter (and/or height) smaller than a height of each of the guide rings 30 (or 30').

Referring to FIG. 11B, second lower solder balls 86 may be formed on the second lower ball pads 60 of the second substrate 50. The second lower solder balls 86 may be electrically connected to the second integrated circuit chip 80 by the second bumps 82, the second bump pads 63, the second wire 54, and the second lower ball pads 60.

Figure 12A:
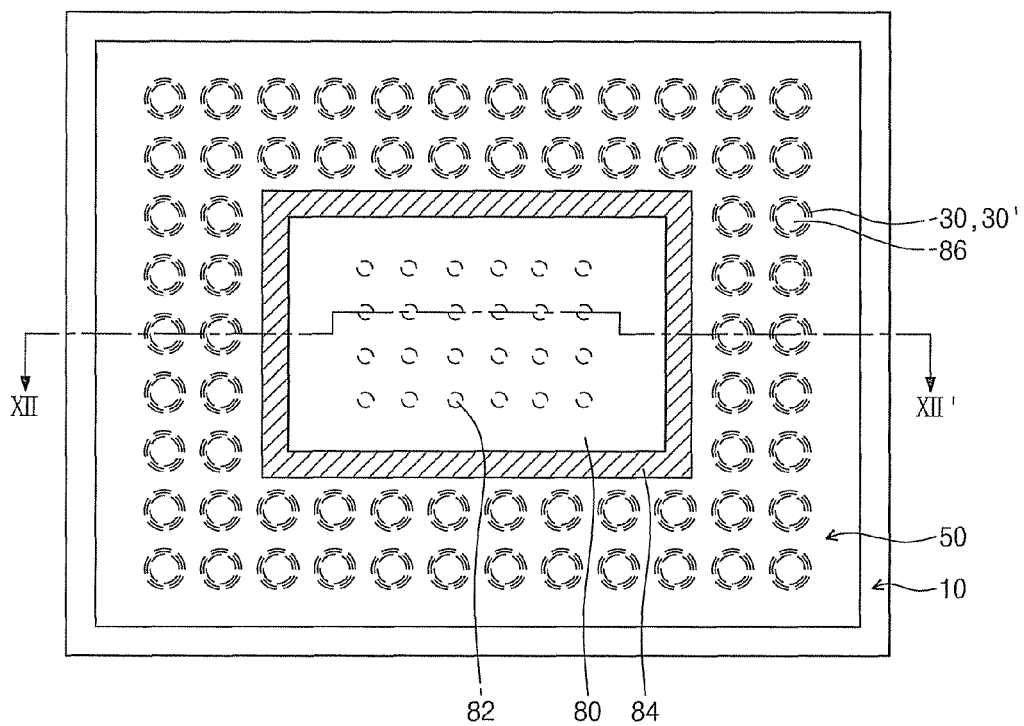
Figure 12B:
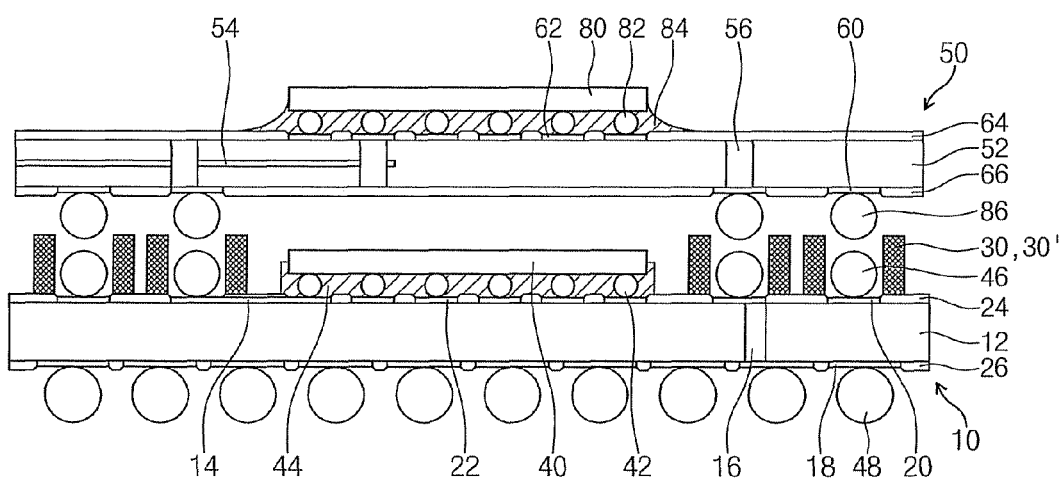

FIGS. 12A and 12B are a process top plan view and a cross-sectional view illustrating the first substrate 10 and the second substrate 50 may be bonded to each other. FIG. 12B is a cross-sectional view taken along the line XII-XII' in FIG. 12A. FIG. 12A shows that the first substrate 10 and the second substrate 50 overlap each other, and FIG. 12B shows that second lower solder balls 86 are aligned with guide rings 30 (or 30') when the first substrate 10 and the second substrate 50 are bonded to each other.

Referring to FIGS. 12A and 12B, the guide rings 30 (or 30') may allow the second lower solder balls 86 and the first upper solder balls 46 to be aligned during the bonding of the first substrate 10 and the second substrate 50 to each other. The guide rings 30 (or 30') may enhance alignment efficiency of the first substrate 10 and the second substrate 50. Thus, the manufacturing method of a semiconductor package according to example embodiments of the inventive concepts may increase or production yields.

The second lower solder balls 86 may be inserted into the guide rings 30 (or 30'). Each of the second lower solder balls 86 may have the same size (or different size) as each of the first upper solder balls 46. Each of the guide rings 30 (or 30') may have a smaller height than each of the first upper solder balls 46 and each of the second lower solder balls 86. The first substrate 10 and the second substrate 50 may compress the first upper solder balls 46 and the second lower solder balls 86 when they are bonded to each other. The second substrate 50 may be compressed toward the first substrate 10 until the guide rings 30 (or 30') and a second lower photo solder resist 66 may press each other. The first substrate 10 and the second substrate 50 may be spaced apart from each other at regular intervals by the guide rings 30 (or 30'). The guide rings 30 (or 30' or 30") may serve as a spacer between the first substrate 10 and the second substrate 50. Afterwards, the first substrate 10 and the second substrate 50 may be treated to bond a first upper photo solder resist 24 to the second lower photo solder resist 66. Thus, the guide rings 30 (or 30' or 30") may fix the first substrate 10 and the second substrate 50 to each other. First substrate 10 and second substrate 50 may be treated, for example, by a heating process that melt bonds the first upper photo solder resist and the second lower photo solder resist, but example embodiments are not limited thereto. In addition, the guide rings 30 (or 30') may insulate the first upper solder balls 46 and the second lower solder balls 86 between the first substrate 10 and the second substrate 50. The guide rings 30 may protect the first lower solder balls 46 and the second lower solder balls 86.

As a result, the manufacturing method of a semiconductor package according to example embodiments of the inventive concepts may increase production yield.

While example embodiments of the inventive concepts have been particularly shown and described, it will be understood by one of ordinary skill in the art that various changes in form and detail may be made therein without departing from the spirit and scope of the claims.

What is claimed is:

1. A semiconductor package comprising:
a first substrate including a first pad;
a second substrate upwardly spaced apart from the first substrate,
the second substrate including a second pad opposite to the first pad;
at least one electrode coupled between the first pad and the second pad; and
a guide ring formed at a periphery of the electrode between the first substrate and the second substrate,
wherein the guide ring includes a tube having uniform cross sections or a plurality of pillars and the at least one electrode is arranged inside the tube or inside the plurality of pillars.

2. The semiconductor package as set forth in claim 1, wherein
the guide ring is configured to conform to a shape of the periphery of the at least one electrode.

3. The semiconductor package as set forth in claim 2, wherein
the guide ring is arranged between the at least one electrode and an adjacent electrode, and
the guide ring is configured to prevent an electrical short between the at least one electrode and the adjacent electrode.

4. The semiconductor package as set forth in claim 2, wherein
the guide ring includes a top surface and a bottom surface, the top surface of the guide ring is connected to the second substrate, and
the bottom surface of the guide ring is connected to the first substrate.

5. The semiconductor package as set forth in claim 2, wherein
the tube surrounds the at least one electrode,
and the tube is configured to conform to a circumference of the at least one electrode.

6. The semiconductor package as set forth in claim 5, wherein
the at least one electrode includes at least one solder ball arranged within the guide ring.

7. The semiconductor package as set forth in claim 5, wherein
the guide ring is arranged between the at least one electrode and an adjacent electrode, and
the guide ring is configured to prevent an electrical short between the at least one electrode and the adjacent electrode.

8. The semiconductor package as set forth in claim 2, wherein
the electrode includes at least one solder ball arranged within the guide ring.

9. The semiconductor package as set forth in claim 2, wherein
the guide ring is arranged between the at least one electrode and an adjacent electrode, and
the guide ring is configured to prevent an electrical short between the at least one electrode and the adjacent electrode.

10. The semiconductor package as set forth in claim 1, wherein
the plurality of pillars include at least four pillars, each pillar is positioned at a different position along the circumference of the at least one electrode such that a line between each adjacent pillar forms a four-sided perimeter surrounding the at least one electrode.

11. The semiconductor package as set forth in claim 10, wherein
the guide ring includes a top surface and a bottom surface, the top surface of the guide ring is connected to the second substrate, and
the bottom surface of the guide ring is connected to the first substrate.

12. The semiconductor package as set forth in claim 1, wherein
the guide ring contains one of a dielectric material and a high-molecular compound.

13. The semiconductor package as set forth in claim 12, wherein
the first substrate further includes a first photo solder resist configured to support the guide ring, and
the second substrate further includes a second photo solder resist supported by the guide ring.

14. A semiconductor package comprising:
a first substrate including a first pad;
a second substrate upwardly spaced apart from the first substrate and including a second pad opposite to the first pad;
at least one electrode coupled between the first pad and the second pad;
a guide ring formed at a periphery of the at least one electrode between the first substrate and the second substrate,
the guide ring including a top surface and a bottom surface, the top surface of the guide ring is connected to the second substrate, and the bottom surface of the guide ring is connected to the first substrate, wherein the guide ring includes a tube having uniform cross sections or a plurality of pillars and the at least one electrode is arranged inside the tube or inside the plurality of pillars.

15. The semiconductor package as set forth in claim 14, wherein the plurality of pillars include at least four pillars, each pillar is positioned at a different position along the circumference of the electrode such that a line between each adjacent pillar forms a four-sided perimeter surrounding the at least one electrode.

16. A semiconductor package comprising:

a first substrate including a first pad;

a second substrate upwardly spaced apart from the first substrate, the second substrate including a second pad opposite to the first pad;

at least one electrode coupled between the first pad and the second pad; and a guide ring formed at a periphery of the at least one electrode between the first substrate and the second substrate, wherein the first substrate further includes a first photo solder resist configured to support the guide ring, and the second substrate further includes a second photo solder resist supported by the guide ring.

17. The semiconductor package as set forth in claim 16, wherein the guide ring is on the first photo solder resist at a circumference of the first pad.

18. The semiconductor package as set form in claim 1, wherein the guide ring is configured to conform to a circumference of the at least one electrode.

19. The semiconductor package as set form in claim 14, wherein the guide ring is configured to conform to a circumference of the at least one electrode.

* * * * *